United States Patent
Hattori et al.

(10) Patent No.: US 12,166,465 B2
(45) Date of Patent: Dec. 10, 2024

(54) BONDED BODY AND ACOUSTIC WAVE ELEMENT

(71) Applicant: NGK INSULATORS, LTD., Nagoya (JP)

(72) Inventors: Ryosuke Hattori, Ichinomiya (JP); Keiichiro Asai, Nagoya (JP); Tomoyoshi Tai, Inazawa (JP); Yudai Uno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 374 days.

(21) Appl. No.: 17/579,678

(22) Filed: Jan. 20, 2022

(65) Prior Publication Data

US 2022/0149811 A1    May 12, 2022

Related U.S. Application Data

(63) Continuation of application No. PCT/JP2020/007117, filed on Feb. 21, 2020.

(30) Foreign Application Priority Data

Jul. 22, 2019  (JP) .................. 2019-134285

(51) Int. Cl.
*H03H 9/02* (2006.01)
*H03H 3/10* (2006.01)
*H10N 30/072* (2023.01)

(52) U.S. Cl.
CPC .......... *H03H 9/02574* (2013.01); *H03H 3/10* (2013.01); *H10N 30/072* (2023.02)

(58) Field of Classification Search
CPC ........ H03H 9/02574; H03H 3/10; H03H 3/08; H03H 9/02834; H03H 9/02866;
(Continued)

(56) References Cited

U.S. PATENT DOCUMENTS 7,213,314 B2   5/2007 Abbott et al.
7,525,399 B2 * 4/2009 Yanase .................. H03H 9/568
                                                     333/187
(Continued)

FOREIGN PATENT DOCUMENTS

JP     201016481 A    1/2010
JP     201284753 A    4/2012
(Continued)

OTHER PUBLICATIONS

International Search Report with English Translation issued in corresponding International Application No. PCT/JP2020/007117 date of mailing Apr. 21, 2020 (5 pages).

(Continued)

*Primary Examiner* — Rakesh B Patel
*Assistant Examiner* — Jorge L Salazar, Jr.
(74) *Attorney, Agent, or Firm* — FLYNN THIEL, P.C.

(57) ABSTRACT

A bonded body includes a supporting substrate, piezoelectric material substrate and a multilayer film between the supporting substrate and piezoelectric material substrate. The multilayer film includes a lamination structure having a first layer, second layer, third layer and fourth layer in that order. The first layer and third layer are composed of silicon oxides, and the second layer and fourth layer are composed of metal oxides. The refractive index of the second layer is higher than the refractive index of the first layer and refractive index of the third layer. The refractive index of the second layer is different from the refractive index of the fourth layer.

11 Claims, 8 Drawing Sheets

(58) Field of Classification Search
CPC .. H03H 9/02559; H10N 30/072; H10N 30/50; H10N 30/853
USPC ................................ 333/187, 188, 193–196
See application file for complete search history.

(56) References Cited

U.S. PATENT DOCUMENTS

| | | |
|---|---|---|
| 2012/0093186 A1 | 4/2012 | Murayama |
| 2015/0219798 A1 | 8/2015 | Sonoda et al. |
| 2015/0256146 A1 | 9/2015 | Hsu |
| 2016/0238759 A1* | 8/2016 | Sprague .............. C23C 14/0652 |
| 2017/0228072 A1 | 8/2017 | Amin et al. |
| 2019/0007022 A1 | 1/2019 | Goto et al. |
| 2019/0036009 A1 | 1/2019 | Tai et al. |
| 2019/0372547 A1 | 12/2019 | Kishimoto et al. |
| 2021/0107258 A1 | 4/2021 | Horie et al. |

FOREIGN PATENT DOCUMENTS

| | | |
|---|---|---|
| JP | 201486400 A | 5/2014 |
| JP | 2017538189 A | 12/2017 |
| WO | 2014061236 A1 | 4/2014 |
| WO | 2017163722 A1 | 9/2017 |
| WO | 2018154950 A1 | 8/2018 |
| WO | 2018180287 A1 | 10/2018 |
| WO | 2018180827 A1 | 10/2018 |
| WO | 2018207555 A1 | 11/2018 |
| WO | 2019058999 A1 | 3/2019 |

OTHER PUBLICATIONS

Written Opinion of International Searching Authority issued in corresponding International Application No. PCT/JP2020/007117 dated Apr. 21, 2020 (4 pages).
Notice of Decision of Refusal in corresponding Taiwan Application No. 109108100 dated Mar. 8, 2021 (4 pages).
Notice of Reasons for Refusal with English translation (Japanese Office Action) issued in corresponding Japanese Application No. 2020-543830 dated Dec. 15, 2020 (6 pages).
Taiwan Office Action issued in corresponding Taiwanese Application No. 109108100 date of mailing, Sep. 14, 2020 (7 pages).
English Translation of the International Preliminary Report on Patentability, issued in corresponding International Application No. PCT/JP2020/007117, Date of Mailing Feb. 3, 2022 (6 pages).

* cited by examiner

BONDED BODY AND ACOUSTIC WAVE ELEMENT

CROSS-REFERENCE TO RELATED APPLICATIONS

This is a continuation of PCT/JP2020/007117, filed Feb. 21, 2020, which claims priority to Japanese Application No. JP2019-134285 filed on Jul. 22, 2019, the entire contents of which are hereby incorporated by reference.

TECHNICAL FIELD

The present invention is related to a bonded body of a piezoelectric material substrate and a supporting substrate and an acoustic wave device.

BACKGROUND ARTS

A surface acoustic wave device functioning as a filter device or oscillator used in mobile phones or the like, and an acoustic wave device such as a lamb wave device or a film bulk acoustic resonator (FBAR) including a piezoelectric thin film are known. As such an acoustic wave device, a device produced by adhering a supporting body and a piezoelectric substrate propagating a surface acoustic wave, by providing interdigitated electrodes capable of oscillating the surface acoustic wave on a surface of the piezoelectric substrate, is known. By adhering the supporting body whose thermal expansion coefficient is lower than that of the piezoelectric substrate onto the piezoelectric substrate, the change of size of the piezoelectric substrate responsive to temperature change is reduced so that the change of the frequency characteristics of the surface acoustic wave device is reduced.

When the piezoelectric substrate and silicon substrate are bonded with each other, a silicon oxide film is formed on the surface of the piezoelectric substrate and the piezoelectric substrate and silicon substrate are directly bonded with each other through the silicon oxide film (patent document 1). During the bonding, a plasma beam is irradiated onto the surfaces of the silicon oxide film and of the silicon substrate to activate the surfaces, and the direct bonding is performed (plasma activation method).

A direct bonding method according to a so-called FAB (Fast Atom Beam) System (patent document 2) is also known. According to the method, a neutralized atomic beam is irradiated onto the respective bonding surfaces at ambient temperature to activate them, which are directly bonded with each other.

Further, it is proposed to provide an intermediate layer composed of $Ta_2O_5$ or the like between the piezoelectric material substrate and the supporting substrate, and to irradiate a neutralized beam onto both of the intermediate layer and the supporting substrate to activate the respective surfaces, which are directly bonded with each other (Patent document 3).

According to patent document 4, a structure including a supporting substrate, a piezoelectric material substrate and a multilayer film having a plurality of $SiO_2$ layers and $Ta_2O_5$ layers laminated with each other is proposed.

(Patent document 1) U.S. Pat. No. 7,213,314 B2
(Patent document 2) Japanese Patent Publication No. 2014-086400 A
(Patent document 3) WO 2017/163722 A1 (Patent document 4) WO 2018/154950 A1

SUMMARY OF THE INVENTION

According to the acoustic wave device of patent document 3, the improvement of performance of Q value or the like is observed in applications for the medium frequency range (applications for 4G of 0.7 to 3.5 GHz or the like). However, in application for the high frequency range (5G application of 3.5 to 6 GHz or the like), it has been shown that the improvement of the Q value is small.

Further, in an acoustic wave device, inserting a multilayer film of $SiO_2/Ta_2O_5$ between the supporting substrate and piezoelectric material substrate as described in patent document 4, an acoustic wave leaked from the piezoelectric material substrate toward the supporting substrate, being reflected at the multilayer film for reducing the loss. However, in the applications for the high frequency range (5G of 3.5 to 6 GHz or the like), it has been shown that the improvement of the Q-value is not necessarily sufficient even in such an acoustic wave device.

An object of the present invention is to provide a bonded body capable of improving the Q value of an acoustic wave device.

The present invention provides a bonded body comprising:
 a supporting substrate;
 a piezoelectric material substrate; and
 a multilayer film between the supporting substrate and the piezoelectric material substrate,
 wherein the multilayer film includes a lamination structure comprising a first layer, a second layer, a third layer and a fourth layer in the order;
 wherein the first layer and the third layer comprise silicon oxides, respectively;
 wherein the second layer and the fourth layer comprise metal oxides, respectively;
 wherein a refractive index of the second layer is higher than a refractive index of the first layer and a refractive index of the third layer; and
 wherein the refractive index of the second layer is different from a refractive index of the fourth layer.

The present invention provides an acoustic wave device comprising:
 the bonded body; and
 an electrode provided on the piezoelectric material substrate.

As described in patent document 4, the inventors have researched the reason why improvement of the Q value is not necessarily sufficient in the acoustic wave device having a multilayer film of $SiO_2$ and $Ta_2O_5$ inserted between the supporting substrate and piezoelectric material substrate for applications for high frequency (applications for 5G of 3.5 to 6 GHz or the like). As a result, as the quality of the multilayer film suitable for medium frequency (4G or the like) and the quality of the multilayer film suitable for high frequency (5G or the like) are different, it is speculated that it is difficult to obtain a desired Q value in the high frequency range.

Based on such speculation, the inventors tried to provide the lamination structure including the first layer, second layer, third layer and fourth layer in the order in the multilayer film, to form the first layer and third layer of silicon oxides and to form the second layer and fourth layer of the metal oxides whose refractive indices are higher than the refractive indices of the silicon oxides. Further, as the refractive index of the second layer and refractive index of the fourth layer composed of the metal oxides are different from each other, it was found that the Q value is further improved. Particularly, even in the high frequency band (5G band), a high Q value can be obtained. The present invention is thus made.

MODES FOR CARRYING OUT THE INVENTION

Figure 1A:
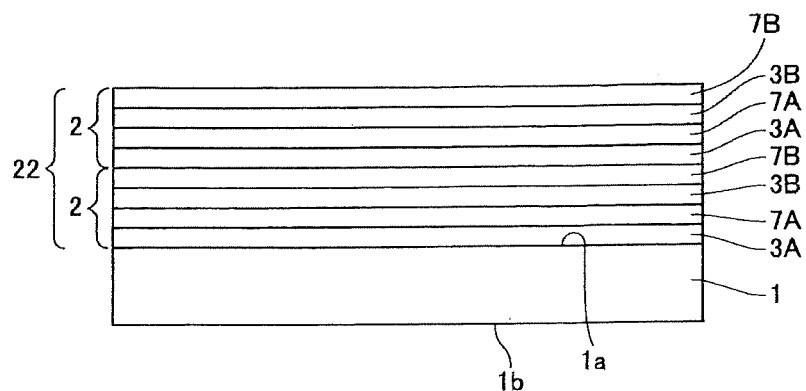
FIG. 1(a) shows the state of a multilayer film 22 provided on a piezoelectric material substrate 1.

The present invention will be described in detail, appropriately referring to the drawings.

As shown in FIG. 1(a), a piezoelectric material substrate 1 has a pair of surfaces 1a and 1b. A multilayer film 22 is film-formed on one surface 1a. According to the present example, the multilayer film 22 is obtained by providing, for example, two lamination structures on the piezoelectric material substrate 1. Each of the laminated structures 2 has the structure of alternately providing a first layer 3A, a second layer 7A, a third layer 3B and a fourth layer 7B from the side of the piezoelectric material substrate 1. Further, although the first layer, second layer, third layer and fourth layer are laminated in order from the side of the piezoelectric material substrate according to the present example, the fourth layer, third layer, second layer and first layer may be laminated in order from the side of the piezoelectric material substrate 1.

Figure 1B:
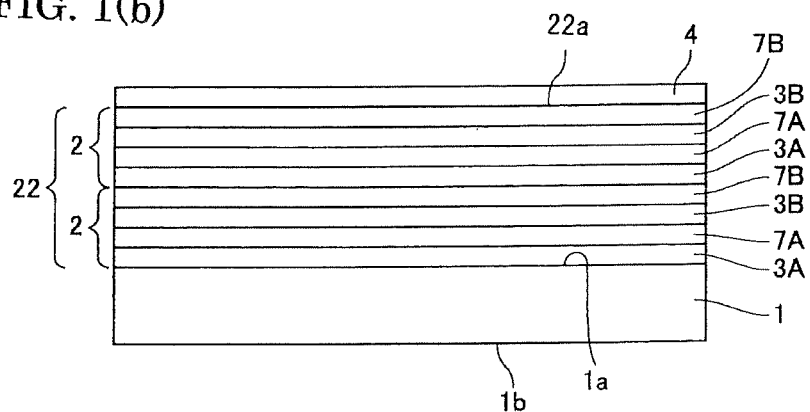
FIG. 1(b) shows the state of a bonding layer 4 provided on the multilayer film 22.
Figure 1C:
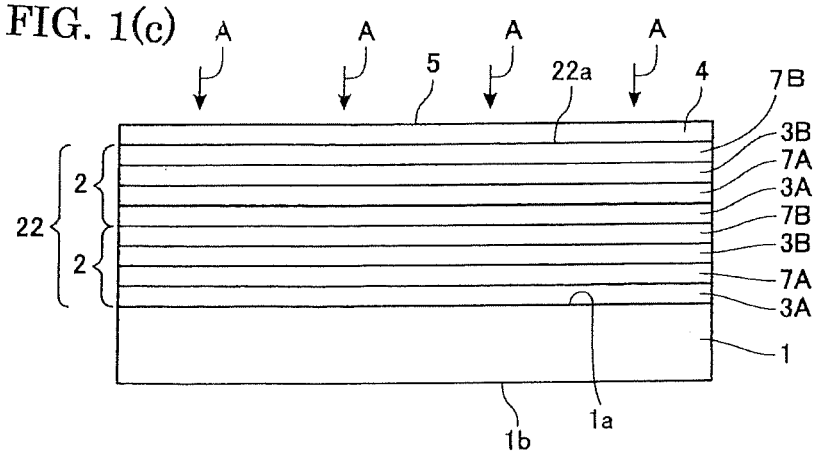
FIG. 1(c) shows the state of a surface of the bonding layer 4 activated.

As shown in FIG. 1(b), a bonding layer 4 may be further provided on the surface 22a of the multilayer film 22. In this case, as shown in FIG. 1(c), a neutralized beam is irradiated onto the surface of the bonding layer 4, shown as arrows A, so that the surface of the bonding layer 4 is activated to provide an activated surface 5.

Figure 2A:
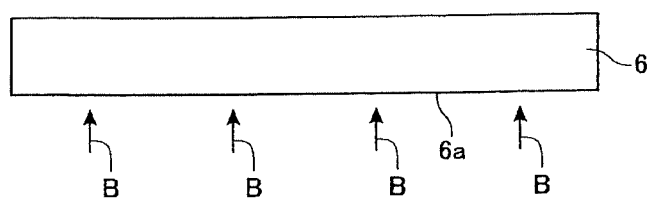
FIG. 2(a) shows the state of a surface of a supporting substrate 6 activated.
Figure 2B:
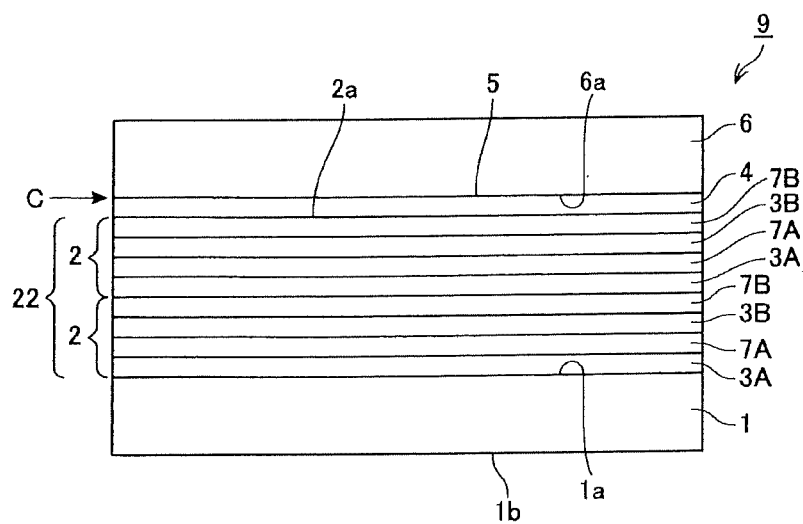
FIG. 2(b) shows a bonded body 9 of the supporting substrate and piezoelectric material substrate.

Further, as shown in FIG. 2(a), a neutralized beam is irradiated onto the surface of the supporting substrate 6 shown as arrows B, so that the surface of the supporting substrate 6 is activated to provide an activated surface 6a. Then, as shown in FIG. 2(b), the activated surface 5 of the bonding layer 4 and activated surface 6a of the supporting substrate 6 are directly contacted under pressure, to obtain a bonded body 9 shown in FIG. 2(b). An arrow C indicates a bonding interface.

Figure 3A:
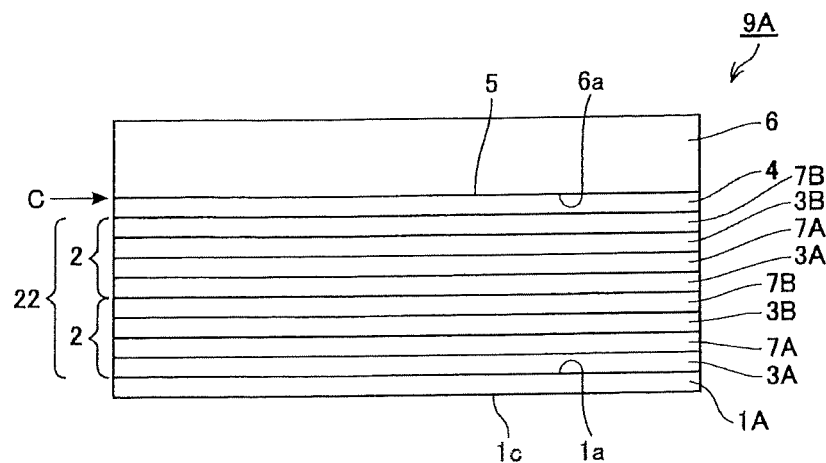
FIG. 3(a) shows the state of a piezoelectric material substrate 1A of a bonded body 9A thinned by the processing.
Figure 3B:
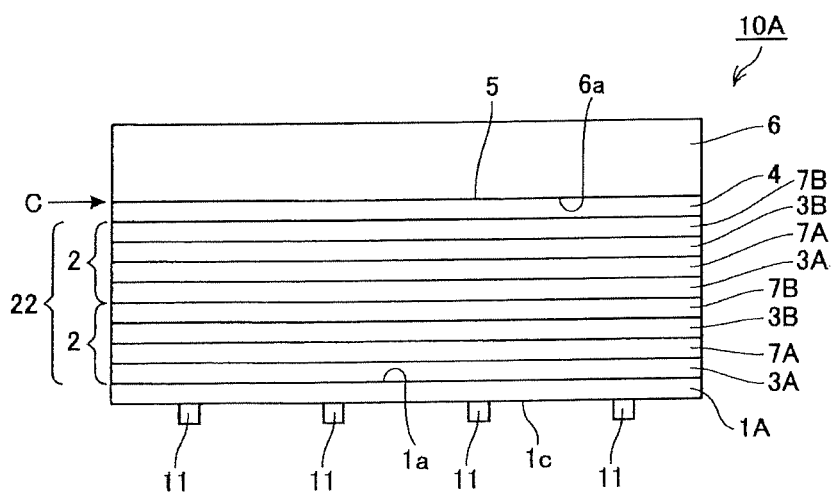
FIG. 3(b) shows the state of an electrode provided on the bonded body 9A.

According to a preferred embodiment, the surface 1b of the piezoelectric material substrate 1 of the bonded body 9 is further subjected to a polishing process to reduce the thickness of a piezoelectric material substrate 1A to obtain a bonded body 9A, as shown in FIG. 3(a). 1c represents a polished surface. As shown in FIG. 3(b), predetermined electrodes 11 are formed on the polished surface 1c of the piezoelectric material substrate 1A to produce an acoustic wave device 10A.

Figure 4A:
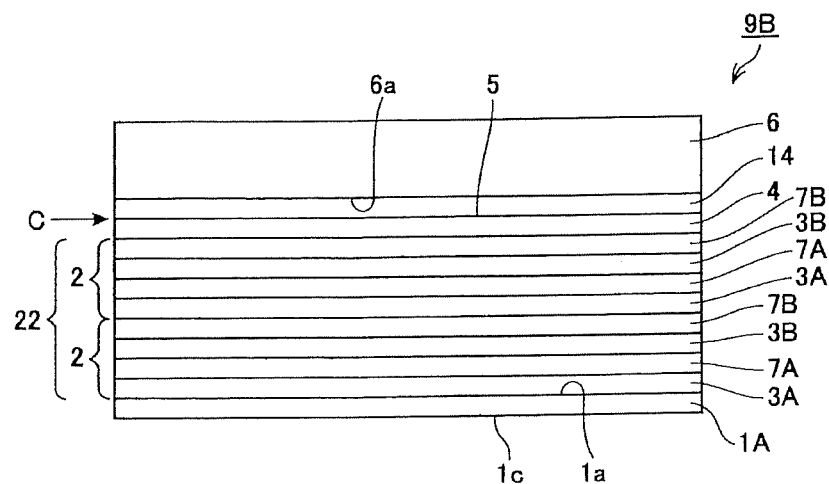
FIG. 4(a) shows a bonded body 9B obtained by directly bonding a bonding layer 4 provided on a multilayer film and a bonding layer 14 provided on the supporting substrate 6.
Figure 4B:
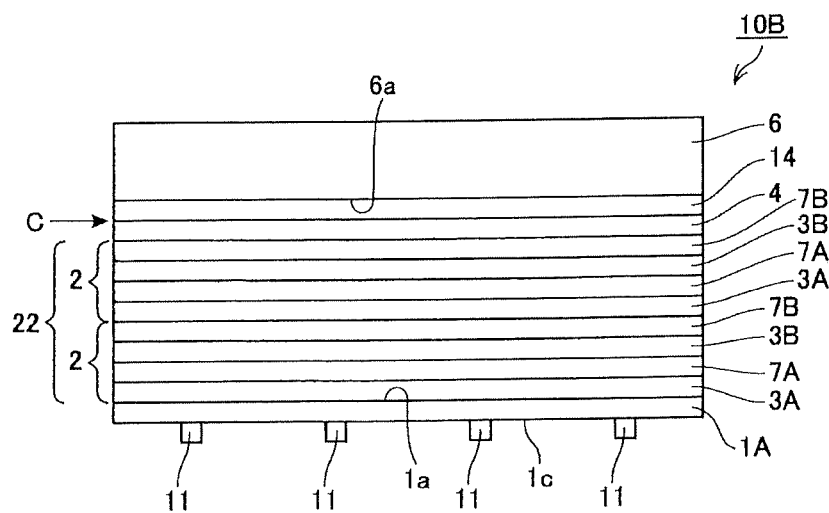
FIG. 4(b) shows an acoustic wave device 10B obtained by providing electrodes 11 on the piezoelectric material substrate 1A of the bonded body 9B.

According to a preferred embodiment, a bonding layer 14 is provided on the supporting substrate so that the bonding layer 14 is directly bonded with the bonding layer on the multilayer film. It is thus possible to obtain a bonded body 9B shown in FIG. 4(C). The bonding interface is indicated by an arrow C. As shown in FIG. 4(b), an acoustic wave device 10B can be obtained by providing the electrodes 11 on the piezoelectric material substrate 1A of the bonded body.

Figure 5A:
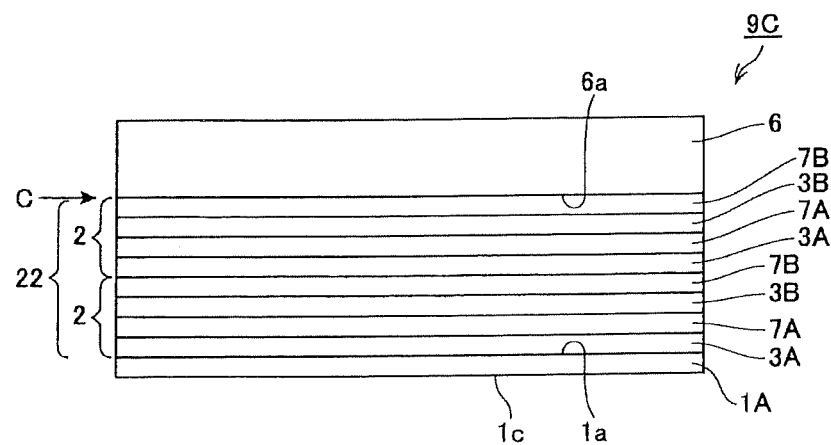
FIG. 5(a) shows a bonded body 9C obtained by directly bonding the multilayer film 22 and supporting substrate 6.
Figure 5B:
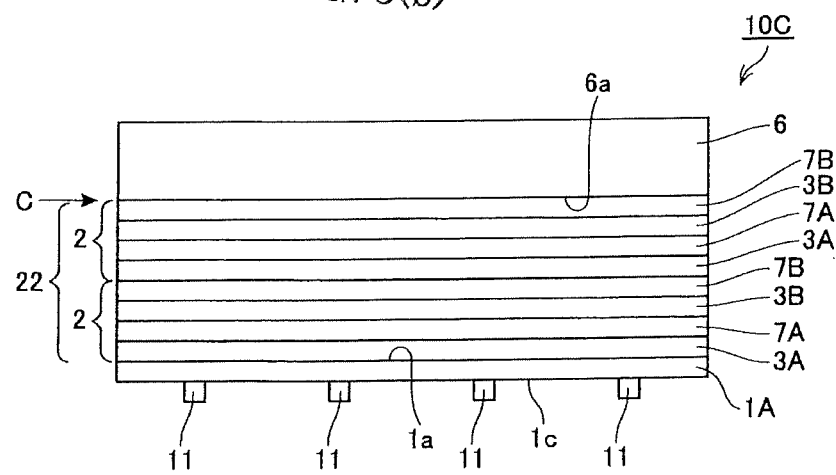
FIG. 5(b) shows the state where electrodes are provided on the piezoelectric material substrate 1A of the bonded body 9C.

Further, according to a preferred embodiment, the supporting substrate and multilayer film are directly bonded. A bonded body 9C shown in FIG. 5(a) is thereby provided. The bonding interface is shown by an arrow C. As shown in FIG. 5(b), an acoustic wave device 10C can be obtained by providing the electrodes 11 on the piezoelectric material substrate 1A of the bonded body.

According to the present invention, the multilayer film provided between the supporting substrate and piezoelectric material substrate includes a first layer, a second layer, a third layer and a fourth layer in that order, the first layer and third layer being composed of silicon oxides, the second layer and fourth layer being composed of metal oxides, the refractive index of the second layer being higher than the refractive index of the first layer and refractive index of the third layer, and the refractive index of the second layer different from the refractive index of the fourth layer. The first layer, second layer, third layer and fourth layer may be arranged from the side of the supporting substrate to the side of the piezoelectric material substrate in order, or alternatively may be arranged in order from the side of the piezoelectric material substrate to the side of the supporting substrate.

The silicon oxides forming the first layer and third layer preferably have a composition of Siox (1.80≤x ≤2.50).

Further, although the metal oxides forming the second layer and fourth layer are not particularly limited, the metal oxides are preferably hafnium oxide, tantalum oxide or zirconium oxide, from the viewpoint of improving the Q value.

Here, the composition of the hafnium oxide is preferably $HfO_z$ (1.80≤z≤2.50). The composition of the tantalum oxide is preferably $Ta_2O_y$ (4.60≤y≤5.50). Further, the composition of the zirconium oxide is preferably $ZrO_z$ (1.80% z≤2.50).

According to a preferred embodiment, the multilayer film includes a plurality of the lamination structures. The modulation of the refractive indices is thus made effective so that the Q-value can be improved effectively. The number of lamination structures of the multilayer film is preferably 2 or more. However, as the number of the lamination structures becomes too large, the effect of restricting the piezoelectric material substrate by the supporting substrate is reduced, so that the number of the lamination structures is preferably 5 or smaller and more preferably 3 or smaller.

From the viewpoint of the present invention, the difference of the refractive index of the second layer and refractive index of the first layer or the refractive index of the third layer is preferably 0.2 or larger and more preferably 0.3 or larger. Further, the difference of the refractive index of the second layer and the refractive index of the first layer or the refractive index of the third layer is preferably 0.8 or smaller and more preferably 0.6 or smaller.

From the viewpoint of the present invention, the difference of the refractive index of the fourth layer and the refractive index of the second layer is preferably 0.02 or larger and more preferably 0.03 or larger. Further, the difference is preferably 0.10 or smaller.

The first layer and third layer are composed of silicon oxides, and the refractive indices are usually 1.40 to 1.58. It is preferred that the refractive index of the first layer and refractive index of the third layer are substantially the same, and the difference of the first layer and the refractive index of the third layer is preferably 0.01 or smaller. Further, as the Q value can be further improved by providing a difference between the refractive index of the first layer and refractive index of the third layer, the difference of the refractive indices of the first layer and third layer is preferably 0.02 or larger and more preferably 0.03 or larger. However, the difference is preferably 0.10 or smaller.

The refractive indices of the respective layers are to be measured under the following conditions.

The measurement is performed by a high-speed spectroscopic ellipsometer using the following system under the following measurement conditions.

"System"

"M-2000" (J. A. Woollam Corporation), Rotation compensation type

"Measurement Conditions"

Incident angle: 65, 70, 75 degrees

Wavelength for measurement: 195 to 1680 nm

Beam size: 2 mm×8 mm

Thereafter, the following analysis is performed.

"Analytical Model"

Metal oxide/silicon oxide/metal oxide/silicon oxide/metal oxide/silicon oxide/metal oxide/silicon oxide/substrate "Analysis Method"

The spectrum of the measured Δ (difference of phase) and φ (amplitude reflectance) is compared with (Δ, φ) calculated based on the analytical model described above, and the dialectic function and film thickness are changed to perform the fitting so as to approach the measured value (Δ, φ). As to the optical constants of the respective films, the value obtained by the reference during the formation of a single layer is made an initial value. The wavelength dispersion of the refractive index is obtained as the result where the measured value and theoretical value are best-fitted (average square error is converged at the minimum value).

The thickness of the first layer, thickness of the second layer, thickness of the third layer and thickness of the fourth layer are preferably 20 nm or larger and more preferably 100 nm or larger. Further, if the thickness of each layer is too large, the restriction of the piezoelectric material substrate by the supporting substrate is weak. From this viewpoint, the thickness of each layer is preferably 300 nm or smaller.

Although the film-forming method of the first layer, second layer, third layer and fourth layer forming the multilayer film is not limited, sputtering method, chemical vapor deposition (CVD) method and vapor deposition may be listed. For example, in the case of sputtering, the refractive index of the second layer and refractive index of the fourth layer can be changed depending on the presence or absence of the bias voltage. That is, the refractive indices of the metal oxide layers can be made relatively high by applying the bias voltage, and the refractive indices of the metal oxide layers can be lowered by not applying the bias voltage. Further, in the case of ion assisted vapor deposition, the refractive index of each layer can be adjusted by adjusting the assist energy. That is, the refractive index of the metal oxide layer can be made relatively high by increasing the assist energy, and the refractive index of the metal oxide layer can be lowered by reducing the assist energy.

The specific production conditions of the respective layers forming the multilayer film are appropriately selected depending on the specification of a chamber. According to a preferred embodiment, the total pressure is 0.28 to 0.34 Pa, the partial pressure of oxygen is $1.2 \times 10^{-3}$ to $5.7 \times 10^{-2}$ Pa, and the film-forming temperature is ambient temperature.

According to a preferred embodiment, one or more bonding layer(s) may be provided between the piezoelectric material substrate and supporting substrate. The material of such bonding layer may be as follows:

$Si_{(1-v)} O_v$, $Ta_2O_5$, $Al_2O_3$, $Nb_2O_5$, $TiO_2$

According to a preferred embodiment, the bonding layer provided between the supporting substrate and piezoelectric material substrate has a composition of $Si_{(1-v)} O_v$ ($0.008 \leq v = 0.408$).

The oxygen ratio of the composition is considerably lower than the oxygen ratio of $SiO_2$ (corresponding with v of 0.667). The insulating property of the bonding layer can be further improved by further interposing the bonding layer composed of the silicon oxide having such composition of $Si_{(1-v)} O_v$.

In the composition of $Si_{(1-v)} O_v$ forming each layer, in the case where v is lower than 0.008, the electrical resistance of the bonding layer becomes low. Thus, v is preferably 0.008 or higher, more preferably 0.010 or higher, particularly preferably 0.020 or higher, and most preferably 0.024 or higher. Further, as the bonding strength is further improved by making v 0.408 or lower, v is preferably 0.0408 or lower, and more preferably 0.225 or lower.

Although the thickness of each bonding layer is not particularly limited, the thickness is preferably 0.01 to 10 μm and more preferably 0.01 to 0.5 μm, from the viewpoint of the production cost.

Although the film-forming method of the respective bonding layers is not limited, sputtering method, chemical vapor deposition method and vapor deposition may be used. Here, particularly preferably, the content of oxygen gas flown in a chamber is adjusted during the reactive sputtering applying Si as a sputtering target, so that it is possible to control the oxygen ratio (v) of each bonding layer.

Although the specific production condition of each bonding layer is appropriately selected depending on the specification of the chamber, according to a preferred example, the total pressure is 0.28 to 0.34 Pa, the partial pressure of oxygen is $1.2 \times 10^{-3}$ to $5.7 \times 10^{-2}$ Pa, and the film-forming temperature is ambient temperature. Further, B-doped Si may be used as the Si target.

The oxygen concentration of the bonding layer is measured by means of EDS under the following conditions.

Measuring System:

Elementary analysis is performed by means of an elementary analysis system "JEM-ARM200F" supplied by JEOL Ltd.

Measurement Conditions:

A sample of a thinned piece is observed by FIB (Focused Ion Beam method) at an accelerating voltage of 200 kV.

According to the present invention, the supporting substrate may be composed of a monocrystalline or polycrystalline material. The material of the supporting substrate is preferably selected from the group consisting of silicon, sialon, sapphire, cordierite, mullite and alumina. The alumina is preferably translucent alumina.

Silicon may be monocrystalline silicon, polycrystalline silicon or high-resistance silicon.

Sialon is a ceramic material obtained by sintering a mixture of silicon nitride and alumina and has the following composition.

$$Si_{6-w}Al_wO_wN_{8-w}$$

That is, sialon has the composition of mixed alumina with silicon nitride, and w indicates the ratio of mixed alumina. w is more preferably 0.5 or more. Further, w is more preferably 4.0 or less.

Sapphire is a single crystal having the composition of $Al_2O_3$, and alumina is a polycrystal having the composition of $Al_2O_3$. Cordierite is a ceramic having the composition of $2MgO \cdot 2Al_2O_3 \cdot 5SiO_2$. Mullite is a ceramic having the composition in a range of $3Al_2O_3 \cdot 2SiO_2$ to $2Al_2O_3 \cdot SiO_2$.

Although the material of the piezoelectric material substrate is not limited as long as it has necessary piezoelectricity, the material is preferably a single crystal having the composition of $LiAO_3$. Here, A represents one or more elements selected from the group consisting of niobium and tantalum. Thus, $LiAO_3$ may be lithium niobate, lithium tantalate or lithium niobate-lithium tantalate solid solution.

Respective constituents of the present invention will be described further in detail below.

The application of the bonded body of the present invention is not particularly limited and, for example, it is preferably applied as an acoustic wave device or optical device.

As the acoustic wave device, a surface acoustic wave device, Lamb wave-type device, thin film resonator (FBAR) or the like are known. For example, the surface acoustic wave device is produced by providing input side IDT (Interdigital transducer) electrodes (also referred to as comb electrodes or interdigitated electrodes) for an oscillating surface acoustic wave and IDT electrodes on the output side for receiving the surface acoustic wave on the surface of the piezoelectric material substrate. By applying a high frequency signal on the IDT electrodes on the input side, an electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A metal film may be provided on a bottom surface of the piezoelectric material substrate. After the Lamb type device is produced as the acoustic wave device, the metal film plays a role of improving the electro-mechanical coupling factor near the bottom surface of the piezoelectric material substrate. In this case, the Lamb type device has the structure of interdigitated electrodes formed on the surface of the piezoelectric material substrate and the metal film on the piezoelectric material substrate is exposed through a cavity provided in the supporting body. Materials of such metal films include aluminum, an aluminum alloy, copper, gold or the like, for example. Further, in the case where the Lamb wave type device is produced, a composite substrate having the piezoelectric single crystal substrate without the metal film on the bottom surface may be used.

Further, a metal film and an insulating film may be provided on the bottom surface of the piezoelectric material substrate. The metal film plays a role of electrodes in the case where a thin film resonator is produced as the acoustic wave device. In this case, the thin film resonator has the structure of electrodes formed on the upper and bottom surfaces of the piezoelectric material substrate and the insulating film has a cavity to expose the metal film on the piezoelectric material substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, an optical switching device, a wavelength conversion device and an optical modulating device are examples. Further, a periodic domain inversion structure may be formed in the piezoelectric material substrate.

In the case where the object of the present invention is an acoustic wave device and the piezoelectric material substrate is made of lithium tantalate, it is preferred to use the substrate rotated from Y-axis to Z-axis by 123 to 133° (for example) 128° around X-axis, which is a direction of propagation of a surface acoustic wave, because of a low propagation loss.

Further, in the case where the piezoelectric material substrate is made of lithium niobate, it is preferred to use the substrate rotated from Y-axis to Z-axis by 86 to 94° (for example) 90° around X-axis, which is the direction of propagation of the surface acoustic wave, because of a lower propagation loss. Further, although the size of the piezoelectric material substrate is not particularly limited, for example, the diameter may be 50 to 150 mm and the thickness may be 0.2 to 60 μm.

The following method is preferred to obtain the inventive bonded body.

First, the respective surfaces to be bonded (the surface of the multilayer film, surface of the bonding layer, surface of the piezoelectric material substrate and surface of the supporting substrate) are flattened to obtain flat surfaces. Here, the method of flattening the respective surfaces includes lapping, chemical mechanical polishing (CMP) and the like. Further, the flat surfaces preferably have an Ra of 1 nm or lower and more preferably 0.3 nm or lower.

Then, for removing the residue of a polishing agent and processing denatured layer, the surfaces of the respective bonding layers are cleaned. The method of cleaning the surfaces includes wet cleaning, dry cleaning, scrub cleaning or the like, and scrub cleaning is preferred from the viewpoint of obtaining a cleaned surface easily and effectively. At this time, it is particularly preferred to use "Sun Wash LH540" as the cleaning agent and then to perform the cleaning by means of a scrub cleaning machine by mixed solution of acetone and IPA.

Then, a neutralized beam is irradiated onto the respective surfaces to activate the respective surfaces.

When the activation of the surfaces is performed by the neutralized beam, it is preferred to use a system described in Patent Document 2 to generate the neutralized beam, which is irradiated. That is, a high-speed atomic beam source of saddle field type is used as the beam source. Then, inert gas is introduced into the chamber and a high voltage is applied onto the electrodes from a direct current electric source. By doing this, an electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high-speed atomic beam source. The atomic specie providing the beam is preferably an inert gas (argon, nitrogen or the like).

In the activation step by beam irradiation, the voltage is preferably 0.5 to 2.0 kV, and the current is preferably 50 to 200 mA.

Then, the activated bonding surfaces are contacted and bonded with each other under vacuum atmosphere. The temperature at this time is ambient temperature, may specifically and preferably be 40° C. or lower and more preferably 30° C. or lower. Further, the temperature during the bonding is more preferably 20° C. or higher and 25° C. or lower. The pressure at the bonding is preferably 100 to 20000N.

EXAMPLES (Preliminary Experiment)

First, a silicon oxide layer or hafnium oxide layer was film-formed on a piezoelectric material substrate to record the film-forming conditions that the respective layers described below obtained. However, the bias voltages were adjusted as follows, for adjusting the refractive index of the hafnium oxide layer.

Silicon oxide layer ($SiO_2$): thickness: 150 nm, refractive index: 1.52

Hafnium oxide layer ($HfO_2$): bias voltage: 100V, thickness: 150 nm, refractive index: 2.07

Hafnium oxide layer ($HfO_2$): bias voltage: 200V, thickness: 150 nm, refractive index: 2.12

Hafnium oxide layer ($HfO_2$): bias voltage: 400V, thickness: 150 nm, refractive index: 2.15

Inventive Example A1

Then, a surface acoustic wave device was produced according to the method described referring to FIGS. 1 to 3.

Specifically, a lithium tantalate substrate (LT substrate) having an OF part, a diameter of 4 inches and a thickness of 250 μm, was applied as the piezoelectric material substrate 1. As the LT substrate, a 128° Y-cut X-propagation LT substrate whose propagating direction of the acoustic surface wave (SAW) was X and the cutting angle was the rotated Y-cut substrate, was applied. The surface 1*a* of the piezoelectric material substrate 1 was subjected to mirror polishing so that the arithmetic average surface roughness Ra reached 0.3 nm. Further, Ra was measured by means of an atomic force microscope (AFM) in a visual field of 10 μm×10 μm.

Then, two laminated structures were formed sequentially on the piezoelectric material substrate 1 by sputtering to obtain the multilayer film 22. Further, the first layer composed of silicon oxide was film-formed on the piezoelectric material substrate first, and the second layer, third layer and fourth layer were formed in the order. The thickness and refractive index of each layer were adjusted as follows based on the preliminary experiment.

First layer ($SiO_2$): thickness: 150 nm, refractive index: 1.53

Second layer ($HfO_2$): thickness: 150 nm, refractive index: 2.12

Third layer ($SiO_2$): thickness: 150 nm, refractive index: 1.53

Fourth layer ($HfO_2$): thickness: 150 nm, refractive index: 2.07

The bonding layer 4 was film-formed on the multilayer film 2. Specifically, direct current sputtering was applied and boron-doped Si was applied as the target. Further, oxygen gas was introduced as the oxygen source. At this time, the amount of the introduced oxygen gas was adjusted to control the total pressure of atmosphere and partial pressure of oxygen in a chamber. The thickness of the bonding layer 4 was 50 nm. The arithmetic average roughness Ra of the surface of the bonding layer 4 was 0.2 to 0.6 nm. Then, the bonding layer 4 was subjected to chemical mechanical polishing (CMP) until the film thickness was 80 to 190 nm and Ra was 0.08 to 0.4 nm.

Further, a supporting substrate 6 having an orientation flat (OF) part, a diameter of 4 inches, a thickness of 500 μm and composed of silicon was prepared. The surface of the supporting substrate 6 was finished by chemical mechanical polishing (CMP) so that the arithmetic average roughness Ra was 0.2 nm.

Then, a neutralized beam was irradiated onto the surface of the bonding layer 4 and onto the Si substrate as the supporting substrate 6 to activate the surfaces, which were directly bonded.

Specifically, the surface of the bonding layer 4 and surface of the supporting substrate 6 were cleaned to remove the contamination, followed by introduction into a vacuum chamber. After it was evacuated to the order of $10^{-6}$ Pa, a high-speed atomic beam (acceleration voltage of 1 kV and Ar flow rate of 27 sccm) was irradiated onto the surfaces over 120 sec. Then, after the beam-irradiated surface (activated surface) of the bonding layer 4 and activated surface of the supporting substrate 6 were contacted with each other, the substrates were bonded by pressurizing at 10000N for 2 minutes. Then, the thus obtained bonded bodies of the respective examples were heated at 100° C. for 20 hours. The thus obtained bonded bodies were subjected to measurement by means of optical ellipsometry to obtain a chart of refractive index shown in FIG. 6.

Then, the surface of the piezoelectric material substrate 1 was subjected to grinding and polishing from the initial 250 μm to 1 μm. Then, electrode patterns for measurement were formed to obtain acoustic surface wave devices. Then, the Q value was measured at a frequency of 5.5 GHz, and is shown in table 1.

Further, the Q value was measured as follows.

A surface acoustic wave resonator was produced on a wafer and the frequency characteristic was measured by means of a network analyzer. The resonance frequency $f_r$ and its half value width $\Delta f_r$ were calculated based on the thus obtained frequency characteristics, and $f_r/\Delta f_r$ was obtained to provide the Q value.

Inventive Example A2

The bonded body and surface acoustic wave device were obtained according to the same procedure as that of the inventive example A1. However, the respective layers forming the multilayer film were adjusted as follows. The Q value of the thus obtained device at a frequency of 5.5 GHz was measured, and is shown in table 1.

First layer (SiO$_2$): thickness: 150 nm, refractive index: 1.53
Second layer (HfO$_2$): thickness: 150 nm, refractive index: 2.15
Third layer (SiO$_2$): thickness: 150 nm, refractive index: 1.53
Fourth layer (HfO$_2$): thickness: 150 nm, refractive index: 2.05

Comparative Example A1

The bonded body and surface acoustic wave device were obtained according to the same procedure as that of the inventive example A1. However, the respective layers forming the multilayer film were adjusted as follows. The thus obtained bonded body was measured by means of optical ellipsometry to obtain a chart of refractive index shown in FIG. 7. Further, the Q value of the thus obtained device at a frequency of 5.5 GHz was measured, and is shown in table 1.

First layer (SiO$_2$): thickness: 150 nm, refractive index: 1.53
Second layer (HfO$_2$): thickness: 150 nm, refractive index: 2.07
Third layer (SiO$_2$): thickness: 150 nm, refractive index: 1.53
Fourth layer (HfO$_2$): thickness: 150 nm, refractive index: 2.07

Comparative Example A2

The bonded body and surface acoustic wave device were obtained according to the same procedure as that of the inventive example A1. However, the respective layers forming the multilayer film were adjusted as follows. The thus obtained bonded body was measured by means of optical ellipsometry to obtain a chart of refractive index shown in FIG. 8. Further, the Q value of the thus obtained device at a frequency of 5.5 GHz was measured, and is shown in table 1.

First layer (SiO$_2$): thickness: 150 nm, refractive index: 1.53
Second layer (HfO$_2$): thickness: 150 nm, refractive index: 2.12
Third layer (SiO$_2$): thickness: 150 nm, refractive index: 1.53
Fourth layer (HfO$_2$): thickness: 150 nm, refractive index: 2.12

Figure 7:
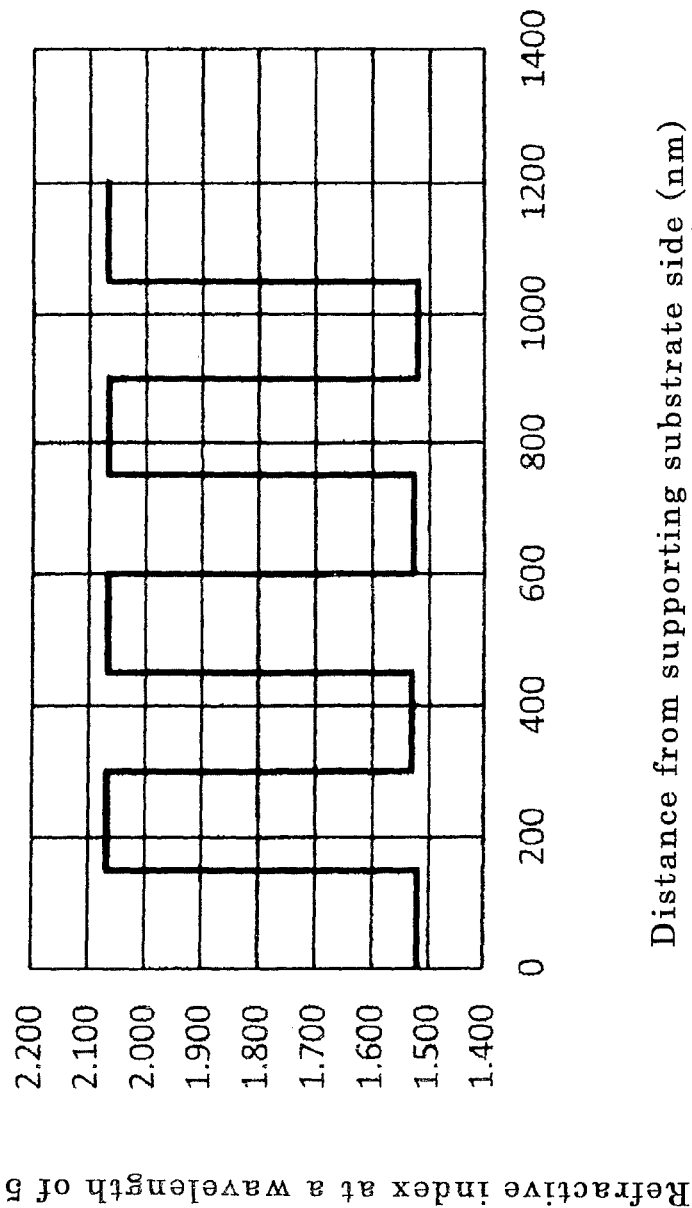
FIG. 7 is a chart showing the distribution of refractive index obtained by optical ellipsometry when the refractive indices of the second and fourth layers are the same and relatively low.

As shown in table 1, according to the comparative example A1, as the refractive indices of the second layer and fourth layer were adjusted to lower values, the refractive indices of the second layer and fourth layers were on the same order as those obtained in the preliminary experiment as shown in FIG. 7.

Figure 8:
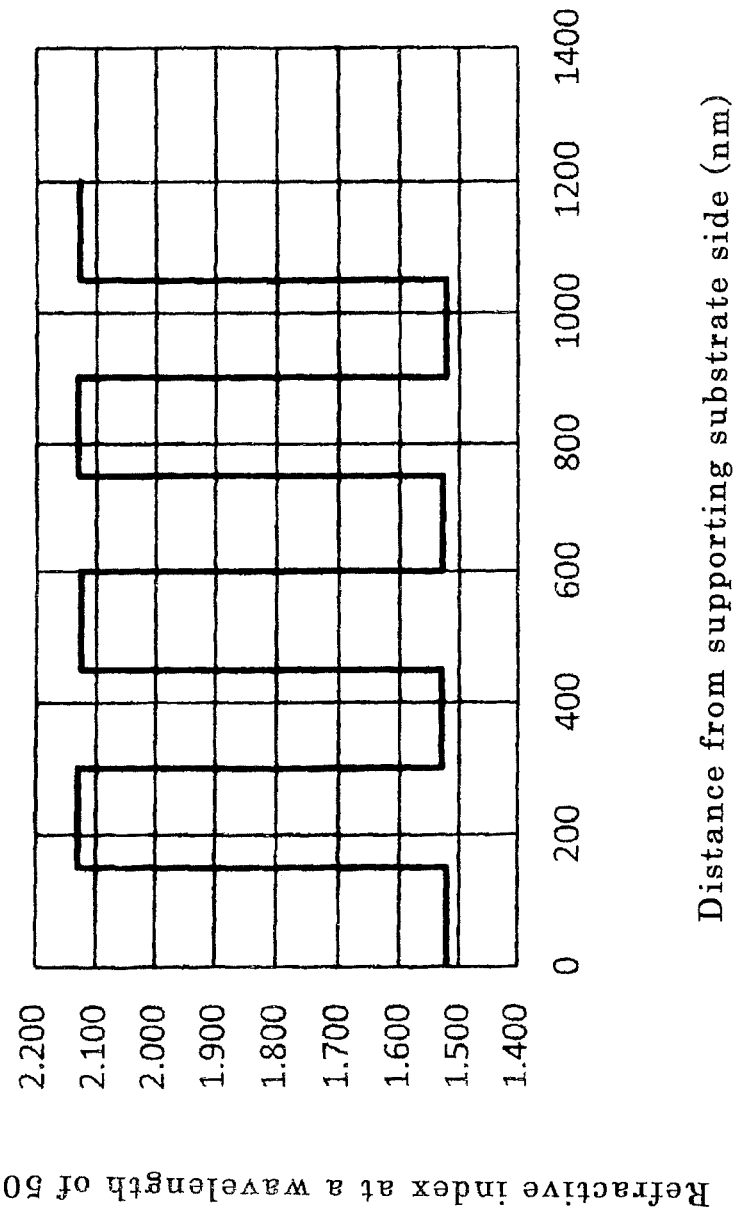
FIG. 8 is a chart showing the distribution of refractive index obtained by optical ellipsometry when the refractive indices of the second and fourth layers are the same and relatively high.

According to the comparative example A2, as the refractive indices of the second layer and fourth layer were adjusted to higher values, the refractive indices of the second layer and fourth layer were on the same order of the refractive indices obtained in the preliminary experiment as shown in FIG. 8. Further, the Q value was the same as that in the comparative example A1, and the effect of an increase of the refractive indices was not observed.

Figure 6:
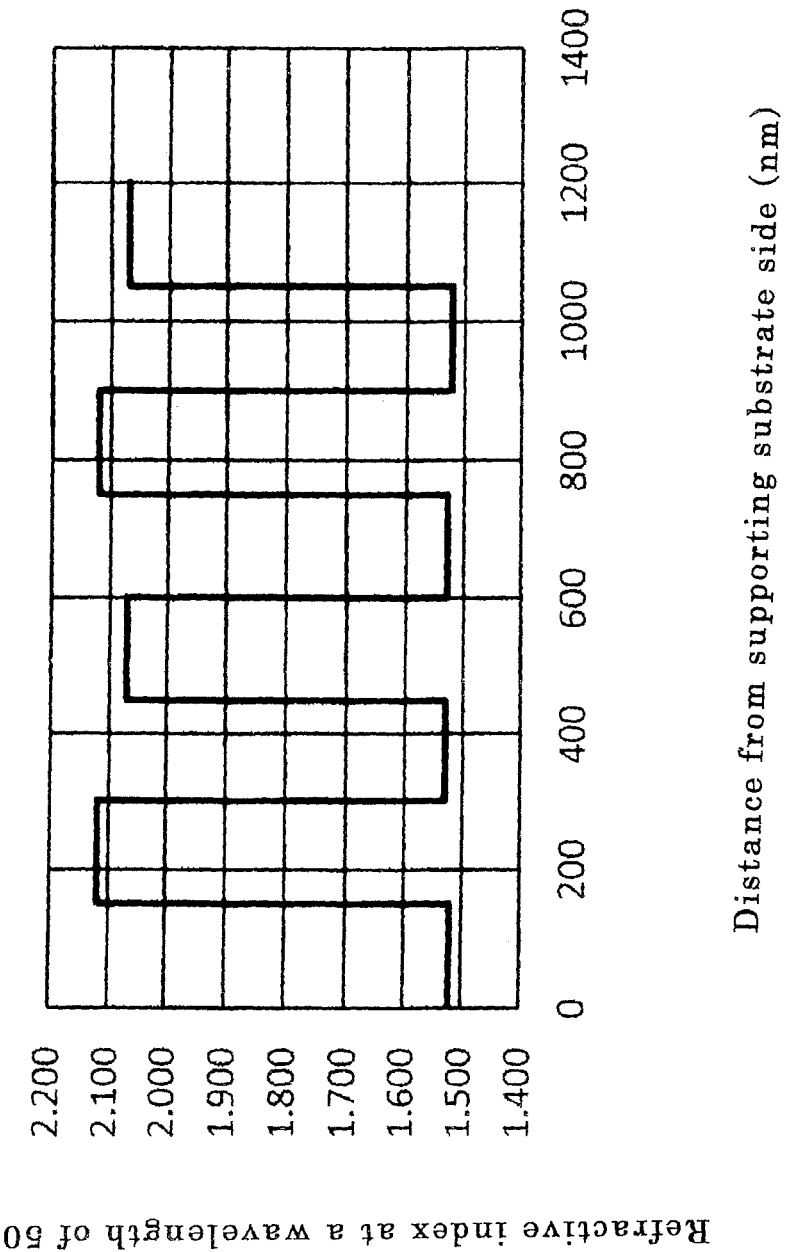
FIG. 6 is a chart showing the distribution of refractive index obtained by optical ellipsometry when the refractive indices of second and fourth layers are different.

According to the inventive example A1, the distribution of refractive index shown in FIG. 6 was obtained.

Further, as shown in table 1, it was proved that the Q value was improved by as large as 20% with respect to the standard value.

According to the inventive example A2, as the refractive index of the second layer and refractive index of the fourth layer were changed, it was observed that the modulation of the refractive index viewed in the direction of thickness was similar to that of FIG. 6.

Further, as shown in table 1, it was proved that the Q value was considerably improved with respect to the standard value.

Inventive Examples B1, B2 and Comparative Examples B1 and B2

With respect to the inventive examples A1 and A2 and comparative examples A1 and A2, the material of the second layer was changed from HfO$_2$ to Ta$_2$O$_5$. Then, as the Q value of the thus obtained devices were measured, results similar to those of the inventive examples A1 and A2 and comparative examples A1 and A2 were obtained.

Inventive Examples C1 and C2 and Comparative Examples C1 and C2

With respect to the inventive examples A1 and A2 and comparative examples A1 and A2, the material of the second layer was changed from HfO$_2$ to Zro$_2$. Then, as the Q value of the thus obtained device was measured, results similar to those of the inventive examples A1 and A2 and comparative examples A1 and A2 were obtained.

TABLE 1

|  | Refractive index of hafnium oxide layer 7A (lamination structure on the lower side)/(lamination structure on the upper side) | Refractive index of hafnium oxide layer 7B (lamination structure on the lower side)/(lamination structure on the upper side) | Result of evaluation of Q value |
| --- | --- | --- | --- |
| Comparative Example A1 | 2.07/2.07 | 2.07/2.07 | Standard (±0%) |
| Comparative Example A2 | 2.12/2.12 | 2.12/2.12 | ±0% |
| Inventive Example A1 | 2.12/2.12 | 2.07/2.07 | +20% |
| Inventive Example A2 | 2.15/2.15 | 2.05/2.05 | +8% |

The invention claimed is:

1. A bonded body comprising:
a supporting substrate;
a piezoelectric material substrate; and
a multilayer film between said supporting substrate and said piezoelectric material substrate,
wherein said multilayer film comprises a lamination structure comprising a first layer, a second layer in contact with the first layer, a third layer in contact with the second layer, and a fourth layer in contact with the third layer;
wherein said first layer and said third layer comprise silicon oxides, respectively;
wherein said second layer and said fourth layer comprise metal oxides, respectively;
wherein a refractive index of said second layer is higher than a refractive index of said first layer and a refractive index of said third layer; and
wherein said refractive index of said second layer is different from a refractive index of said fourth layer.

2. The bonded body of claim 1, wherein said multilayer film comprises a plurality of said lamination structures.

3. The bonded body of claim 1, wherein said metal oxides comprise hafnium oxide, tantalum oxide or zirconium oxide.

4. The bonded body of claim 1, wherein a difference of said refractive index of said second layer and said refractive index of said first layer is 0.3 to 0.8.

5. The bonded body of claim 1, wherein a difference of said refractive index of said second layer and said refractive index of said fourth layer is 0.02 or larger.

6. The bonded body of claim 1, wherein each of a thickness of said first layer, a thickness of said second layer, a thickness of said third layer and a thickness of said fourth layer is 20 nm or larger and 300 nm or smaller.

7. The bonded body of claim 1, further comprising a bonding layer having a composition of $Si_{(1-v)}O_v$ ($0.008 \leq v \leq 0.408$) between said piezoelectric material substrate and said supporting substrate.

8. An acoustic wave device comprising:
the bonded body of claim 1; and
an electrode provided on said piezoelectric material substrate.

9. The acoustic wave device of claim 8 used for an acoustic wave of a frequency of 3.5 to 6 GHZ.

10. A bonded body comprising:
a supporting substrate;
a piezoelectric material substrate; and
a multilayer film between said supporting substrate and said piezoelectric material substrate,
wherein said multilayer film comprises a plurality of lamination structures, each lamination structure comprising a first layer, a second layer, a third layer and a fourth layer in the order;
wherein said first layer and said third layer comprise silicon oxides, respectively;
wherein said second layer and said fourth layer comprise metal oxides, respectively;
wherein a refractive index of said second layer is higher than a refractive index of said first layer and a refractive index of said third layer; and
wherein said refractive index of said second layer is different from a refractive index of said fourth layer.

11. A bonded body comprising:
a supporting substrate;
a piezoelectric material substrate; and
a multilayer film between said supporting substrate and said piezoelectric material substrate,
wherein said multilayer film comprises a lamination structure comprising a first layer, a second layer, a third layer and a fourth layer in the order;
wherein said first layer and said third layer comprise silicon oxides, respectively;
wherein said second layer and said fourth layer comprise metal oxides, respectively;
wherein a refractive index of said second layer is higher than a refractive index of said first layer and a refractive index of said third layer;
wherein said refractive index of said second layer is different from a refractive index of said fourth layer; and
wherein each of a thickness of said first layer, a thickness of said second layer, a thickness of said third layer and a thickness of said fourth layer is 20 nm or larger and 300 nm or smaller.

* * * * *